(12) United States Patent
Sandhu

(10) Patent No.: US 10,886,121 B2
(45) Date of Patent: Jan. 5, 2021

(54) METHODS OF REDUCING SILICON CONSUMPTION, METHODS OF FORMING A SEMICONDUCTOR STRUCTURE, AND METHODS OF FORMING ISOLATION STRUCTURES

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/425,045

(22) Filed: May 29, 2019

(65) Prior Publication Data
US 2019/0355578 A1 Nov. 21, 2019

Related U.S. Application Data

(63) Continuation of application No. 15/982,872, filed on May 17, 2018, now Pat. No. 10,381,218.

(51) Int. Cl.
*H01L 21/02* (2006.01)
*H01L 21/762* (2006.01)

(52) U.S. Cl.
CPC .... *H01L 21/02301* (2013.01); *H01L 21/0206* (2013.01); *H01L 21/0228* (2013.01); *H01L 21/02057* (2013.01); *H01L 21/02164* (2013.01); *H01L 21/76224* (2013.01)

(58) Field of Classification Search
CPC ......... H01L 21/02301; H01L 21/02057; H01L 21/0206; H01L 21/02164; H01L 21/0228; H01L 21/76224

USPC ......................................... 438/400, 438, 424
See application file for complete search history.

(56) References Cited

U.S. PATENT DOCUMENTS

| | | | |
|---|---|---|---|
| 8,962,446 B2 | 2/2015 | Hanson et al. | |
| 9,881,924 B2 | 1/2018 | Wang et al. | |
| 2007/0207590 A1* | 9/2007 | Kiyotoshi | H01L 21/823475 438/424 |
| 2008/0179715 A1 | 7/2008 | Coppa | |
| 2012/0235215 A1 | 9/2012 | Flachowsky et al. | |
| 2013/0267077 A1 | 10/2013 | Hong et al. | |
| 2014/0061780 A1 | 3/2014 | Son et al. | |
| 2014/0134812 A1* | 5/2014 | Kim | H01L 21/28185 438/270 |
| 2014/0346613 A1 | 11/2014 | Tang et al. | |
| 2017/0162395 A1 | 6/2017 | Wu et al. | |

OTHER PUBLICATIONS

Stanley Wolf, Silicon Processing for the VSLI ERA , 1990, Lattice Press, vol. 2 pp. 52-53.
Smythe et al., U.S. Patent Application titled Methods Comprising an Atomic Layer Deposition Sequence filed Jan. 2, 2018., U.S. Appl. No. 15/860,388.

* cited by examiner

*Primary Examiner* — Marc Anthony Armand
(74) *Attorney, Agent, or Firm* — TraskBritt

(57) ABSTRACT

A method of reducing silicon consumption of a silicon material. The method comprises cleaning a silicon material and subjecting the cleaned silicon material to a vacuum anneal at a temperature below a melting point of silicon and under vacuum conditions. The silicon material is subjected to additional process acts without substantially removing silicon of the silicon material. Additional methods of forming a semiconductor structure and forming isolation structures are also disclosed.

22 Claims, 4 Drawing Sheets

METHODS OF REDUCING SILICON CONSUMPTION, METHODS OF FORMING A SEMICONDUCTOR STRUCTURE, AND METHODS OF FORMING ISOLATION STRUCTURES

CROSS-REFERENCE TO RELATED APPLICATION

This application is a continuation of U.S. patent application Ser. No. 15/982,872, filed May 17, 2018, now U.S. Pat. No. 10,381,218, issued Aug. 13, 2019, the disclosure of which is hereby incorporated herein in its entirety by this reference.

TECHNICAL FIELD

Embodiments disclosed herein relate to semiconductor fabrication including the fabrication of semiconductor devices, such as dynamic random-access memory (DRAM) device fabrication. More particularly, embodiments of the disclosure relate to methods of minimizing silicon loss during semiconductor device fabrication, methods of forming a semiconductor structure, and methods of forming isolation structures.

BACKGROUND

Integrated circuits include many electronic devices, such as transistors or capacitors, in active areas of a substrate. In a majority of cases, active areas comprise silicon and various integrated circuit components are isolated from one another by an insulating material, such as a silicon oxide. Integrated circuits with feature dimensions less than about 0.25 µm (250 nm) use shallow trench isolation (STI) to isolate the active areas. Various insulating materials, such as silicon dioxide or silicon nitride, have been used for STI.

To form the electronic devices in the active areas, a photolithography act is conducted on the silicon, followed by a dry etch act to remove portions of the silicon and form STI trenches, a strip act to remove, for example, photoresist, a wet etch act to remove contaminants, such as metal contaminants, an STI oxidation to form a liner in the STI trenches, and an STI oxide fill to fill the STI trenches. Various acts in the STI formation process cause oxidation of the silicon and damage to a surface of the silicon. Forming the liner in the STI trenches also consumes silicon because the liner is formed using a thermal growth process. Therefore, many of the process acts consume silicon, decreasing the active area efficiency. Metal contaminants and polymers are also formed during the process, the removal of which may also consume silicon. As the density of integrated circuits continues to increase and the size of electronic devices in the integrated circuits decreases, the loss of any silicon otherwise available to form circuit components in a high density configuration becomes problematic.

DETAILED DESCRIPTION

Methods of forming semiconductor structures containing a silicon material and isolation structures, such as shallow trench isolation (STI) structures, are disclosed in which the semiconductor structures are formed with minimal consumption (e.g., minimal loss) of the silicon material. The silicon material functions as active areas in which electronic devices are to be formed and, in comparison to conventional fabrication techniques, a significantly increased amount of the silicon material remains following process acts used to form the semiconductor structures. The acts utilized during the fabrication of the semiconductor structures are conducted in a manner to minimize oxidation of, and repair damage to, the silicon material. The acts include, among others, cleaning the silicon material, vacuum annealing the silicon material, and forming a high quality, insulating material on the silicon material. The high quality, insulating material exhibits a high density, a high quality interface, and a high purity and is substantially homogeneous in composition. The high quality, insulating material exhibits a comparable density and comparable purity to that of silicon dioxide prepared by high density plasma (HDP) chemical vapor deposition (CVD) or thermal processing. The surface clean of the silicon material, the vacuum anneal, and the formation of the insulating material are conducted in a single processing apparatus (e.g., in situ) without exposing the silicon material to an oxidative environment that would otherwise oxidize or consume the silicon material. During fabrication of the semiconductor structures, the silicon material is transferred between one or more chambers of the processing apparatus under vacuum conditions. Thus, the surface clean, vacuum anneal, and insulating material formation acts may be conducted without consuming silicon.

Figures 1A, 1B:
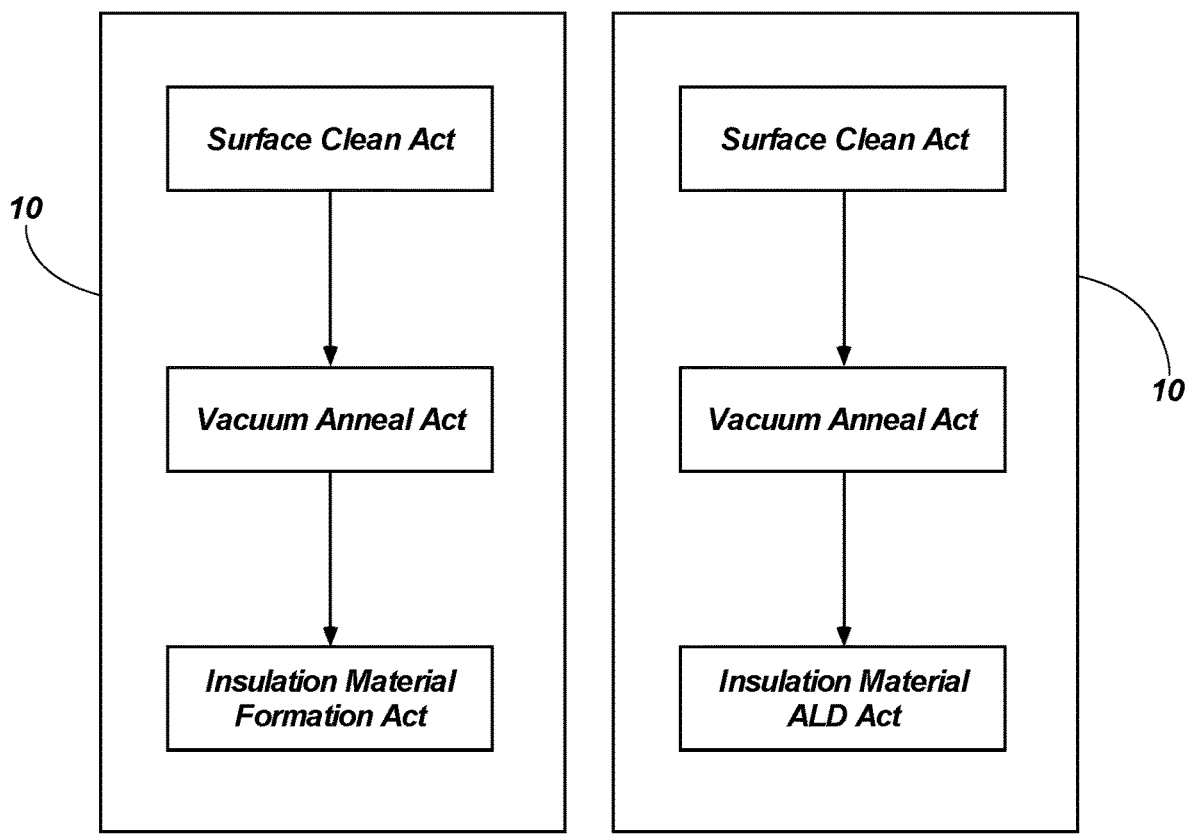
FIGS. 1A and 1B are schematic diagrams showing process acts conducted in accordance with embodiments of the disclosure.

The surface clean act, vacuum anneal act, and insulating material formation act may be conducted in one or more chambers of the processing apparatus. As described in more detail below, the insulating material formation act may be an insulating material atomic layer deposition (ALD) act. FIGS. 1A and 1B are schematic diagrams showing the acts conducted in the processing apparatus 10. The processing apparatus may include, for example, a single chamber (not shown) or multiple chambers (not shown), such as a clean chamber, an anneal chamber, an insulating material formation chamber, etc. The vacuum anneal act and insulating material formation act may be conducted in the same chamber of the processing apparatus, while the surface clean act is conducted in the same chamber or in a different chamber of the processing apparatus. If the surface clean act, the vacuum anneal act, and the insulating material formation act are conducted in different chambers, the silicon material is transferred between the different chambers without breaking the vacuum condition. The processing apparatus is configured to conduct the surface clean act at a first temperature, the vacuum anneal act at a second temperature, and the insulating material formation act at a third temperature where at least two of the first temperature, the second temperature, and the third temperature are different from one another.

By minimizing the silicon consumption (e.g., silicon loss), a semiconductor device, such as a memory device, including the resulting semiconductor structures exhibits high quality isolation between the active areas and low leakage current. Therefore, the methods of forming the semiconductor structures according to embodiments of the disclosure reduce silicon consumption while providing effective isolation of the active areas and provide for a large silicon area to form active devices. Using the methods of forming the semiconductor structures according to embodiments of the disclosure consumes substantially no (e.g., zero) silicon from the silicon material. Using the methods of forming the semiconductor structures according to embodiments of the disclosure consumes from about 5 nm to about 7 nm less silicon than is consumed by conventional STI techniques, which improves scaling of the semiconductor device including the semiconductor structures.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or a complete process flow for manufacturing the semiconductor device and the structures described below do not form a complete semiconductor device. Only those process acts and structures necessary to understand the embodiments described herein are described in detail below. Additional acts to form a complete semiconductor device may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "silicon" means and includes amorphous silicon, monocrystalline silicon, polycrystalline silicon, epitaxial-silicon, or combinations thereof. The silicon may be doped or undoped. In some embodiments, the silicon is monocrystalline silicon.

As used herein, the term "silicon oxide" means and includes a compound having silicon atoms and oxygen atoms, such as silicon monoxide (SiO), silicon dioxide ($SiO_2$), tetraethylorthosilicate (TEOS), or combinations thereof.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "semiconductor device" includes without limitation a memory device, as well as other semiconductor devices which may or may not incorporate memory, such as a logic device, a processor device, a radiofrequency (RF) device. Further, a semiconductor device may incorporate memory in addition to other functions such as, for example, a so-called "system on a chip" (SoC) including a processor and memory, or a semiconductor device including logic and memory.

Figure 2:
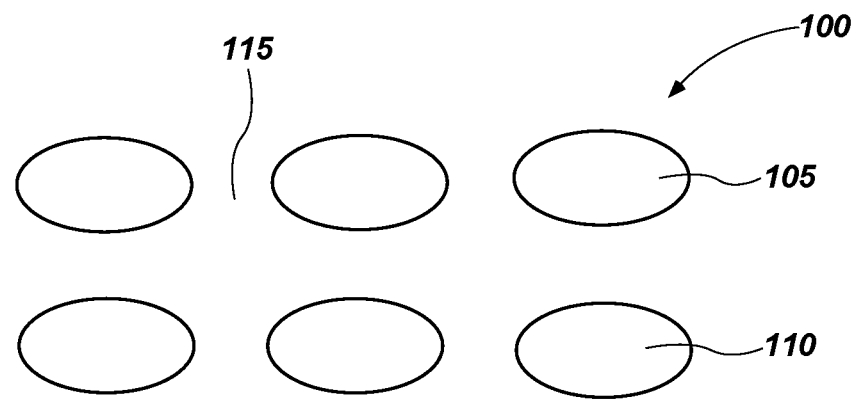
FIG. 2 is a top down view of a semiconductor structure including active areas of silicon material surrounded by an insulating material.

As shown in FIG. 2, a semiconductor structure 100 includes active areas 105 of a silicon material 110 separated from one another by an insulating material 115. FIG. 2 is a top down view of the semiconductor structure 100 in the fabrication of a semiconductor device including the semiconductor structure 100. STI trenches in the silicon material 110 define the active areas 105 in which or upon which the electronic devices are to be formed. The STI trenches are defined by sidewalls and a bottom surface of the silicon material 110. The active areas 105 of the silicon material 110 are isolated from one another by STI structures, which include the insulating material 115 positioned between the active areas 105 in the silicon material 110. The STI structures isolate electronic devices, such as transistors or capacitors, on or in the active areas 105 from one another.

The silicon material 110 is a silicon substrate or a silicon-containing material on a substrate, which is formed from a material other than silicon. The substrate may be a base material upon which other materials are formed. The base material may include one or more materials in addition to the silicon material 110. The silicon material 110 may include silicon in its elemental form where an outer surface of the silicon material 110 may optionally include hydroxyl-terminated functional groups (e.g., —OH). The silicon material 110 may consist of or consist essentially of the silicon. The active areas 105 of the silicon material 110 may form so-called "mesas" having a substantially elliptical shape, although other shapes of the active areas 105 are possible, such as so-called "islands," so-called "fins," or rectangular, square, hexagonal, circular, polygonal, or other curved shapes. Adjacent mesas are isolated from one another by the insulating material 115.

The insulating material 115 may be a silicon oxide, such as $SiO_2$, a silicon oxynitride, a silicon nitride, or combinations thereof. At least a portion of the insulating material 115 may be of a so-called "high quality" in that the insulating material exhibits a high density and a high purity and is substantially homogeneous in composition.

Figure 3:
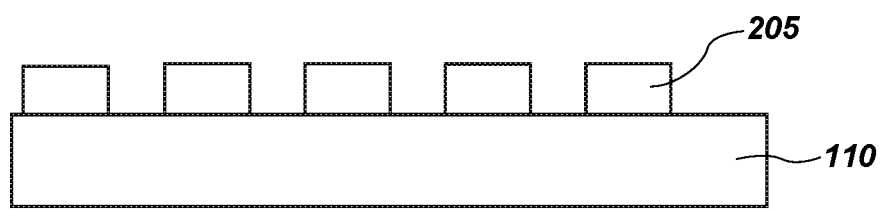
FIGS. 3 and 4 are cross-sectional views of the semiconductor structure during various stages of fabrication in accordance with embodiments of the disclosure.

To form the semiconductor structure 100, a photoresist (not shown) is formed over the silicon material 110 and patterned using conventional photolithography techniques. The patterned photoresist 205 is shown in FIG. 3, which is a cross-sectional view of the semiconductor structure 100 at an initial processing stage. The patterned photoresist 205 is used as a mask to define a corresponding pattern of STI trenches in the silicon material 110, as described in more detail below. A hard mask (not shown) may optionally be formed between the photoresist and the silicon material 110 and patterned using the patterned photoresist 205 as a mask before the pattern is transferred to the silicon material 110. The hard mask may be formed of a single material or of multiple stacked materials, such as silicon nitride, silicon oxynitride, silicon oxide, or combinations thereof.

Figure 4:
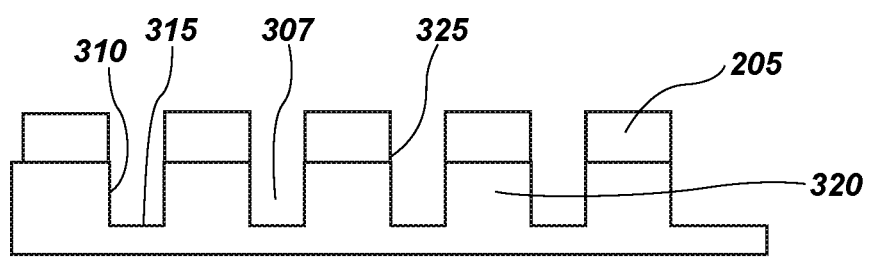

As shown in FIG. 4, portions of the silicon material 110 are removed (e.g., etched) through the mask to form STI trenches 307. A dry etch act is conducted on the silicon material 110 to remove (e.g., etch) the portions of the silicon material 110, forming mesas 320 and the STI trenches 307. The silicon material 110 is etched by conventional techniques using conventional etch chemistries, which are not described in detail herein.

A wet etch act is used to remove the patterned photoresist 205. The patterned photoresist 205 may be removed (e.g., etched) by conventional techniques using conventional etch chemistries, which are not described in detail herein. The patterned photoresist 205 may be removed immediately after forming the STI trenches 307. Alternatively, the patterned photoresist 205 may be removed after filling the STI trenches 307 with the insulating material 115 as described in more detail below. The hard mask, if present, may also be removed after forming the STI trenches 307 or after filling the STI trenches 307 with the insulating material 115.

The patterning of the silicon material 110 and the removal of the patterned photoresist 205 may cause damage to a top surface 325, sidewalls 310, and a bottom surface 315 of the silicon material 110 due to reactive species from the dry etch act and/or the wet etch act. In addition, metal contaminants, polymers, other residues, or combinations thereof, which are collectively referred to herein as so-called "contaminants," may form on the silicon material 110. The surface damage and presence of the contaminants may affect an interface between the silicon material 110 and the insulating material 115, which ultimately affects the performance of the semiconductor device including the semiconductor structure 100. To repair the top surface 325, the sidewalls 310, and the bottom surface 315 of the silicon material 110 and remove (e.g., clean) the contaminants, the silicon material 110 including the STI trenches 307 therein is introduced to (e.g., positioned in) a processing apparatus (not shown) that is configured to both receive and process the silicon material 110 and to form the insulating material 115. The silicon material 110 is subjected to at least one surface clean act and to at least one vacuum anneal act within the processing apparatus before forming the insulating material 115.

The processing apparatus may include, but is not limited to, an ALD apparatus including at least one chamber, where the ALD apparatus is configured to conduct the surface clean act, the vacuum anneal act, and the insulating material formation act under different conditions (e.g., temperature conditions, pressure conditions, and/or gas or reactant conditions) before conducting additional process acts to form the semiconductor device including the semiconductor structure 100. However, other processing apparatuses configured to conduct the surface clean act, the vacuum anneal act, and the insulating material formation act may also be used. The processing apparatus may include multiple chambers, such as at least one clean chamber, at least one vacuum anneal chamber, and at least one material formation chamber, such as an ALD chamber. The surface clean act and the vacuum anneal act may be conducted in a single (e.g., the same) chamber of the processing apparatus. Alternatively, the surface clean act and the vacuum anneal act may be conducted in different chambers of the processing apparatus, such as the surface clean act being conducted in a first chamber of the processing apparatus and the vacuum anneal act being conducted in a second chamber of the processing apparatus. If the surface clean act and the vacuum anneal act are conducted in different chambers of the processing apparatus, the silicon material 110 is transferred between the different chambers under vacuum (e.g., without breaking the vacuum conditions).

The contaminants are removed (e.g., cleaned) from exposed portions of the silicon material 110, such as from the top surface 325, the sidewalls 310, and the bottom surface 315 of the silicon material 110, by conducting one or more surface clean acts on the semiconductor structure 100 shown in FIG. 4, except that the patterned photoresist 205 and hard mask may optionally be removed before conducting the surface clean act. The silicon material 110 may be cleaned by conventional techniques including, but not limited to, exposing the silicon material 110 to an oxidizing chemistry, a reducing chemistry, or combinations thereof. The surface clean act may remove native oxides (e.g., a silicon oxide), the metal contaminants, the polymers, other contaminants (e.g., residues), or combinations thereof from the sidewalls 310 and the bottom surface 315. Depending on the contaminants to be removed, a single cleaning act or multiple cleaning acts may be conducted. The surface clean act may utilize a single chemistry or multiple, different chemistries to remove the contaminants. The surface clean act may be conducted by introducing the appropriate etch chemistry to the processing apparatus and exposing the silicon material 110 to the selected etch chemistry, such as by exposing the silicon material 110 to a hydrogen fluoride (HF) based chemistry, a sulfuric acid ($H_2SO_4$) based chemistry, a chlorine-based chemistry, or combinations thereof. By way of example only, a buffered oxide etch including dilute HF in water or a hydrochloric acid based chemistry may be used to clean the silicon material 110. The silicon material 110 may optionally be exposed to a cleaning gas, such as hydrogen ($H_2$) gas, a hydrochloric acid (HCl) based chemistry, other halogens, or combinations thereof, to further improve the cleaning of the silicon material 110. The silicon material 110 may optionally be exposed to a remote plasma, generating metastable species, to improve the cleaning of the silicon material 110. If present, the cleaning gas is introduced to the processing apparatus by flowing the cleaning gas from a source into the processing apparatus.

The surface clean act may be conducted at a temperature of from about 700° C. to about 2000° C., such as from about 700° C. to about 900° C., from about 700° C. to about 800° C., from about 700° C. to about 750° C., from about 750° C. to about 800° C., from about 700° C. to about 1000° C., from about 800° C. to about 900° C., from about 900° C. to about 1000° C., from about 800° C. to about 850° C., from about 850° C. to about 900° C., from about 900° C. to about 950° C., or from about 950° C. to about 1000° C. This temperature is referred to herein as a so-called "clean temperature" and refers to the temperature of a chuck within the processing apparatus. The semiconductor structure 100 may be positioned on the chuck during the surface clean act, the vacuum anneal act, and the insulating material formation act. The surface clean act may be conducted for an amount of time sufficient to remove substantially all of the contaminants from the top surface 325 and sidewalls 310 of the silicon material 110. Thus, the silicon material 110 is substantially free from contaminants. The surface clean act may, for example, remove greater than about 90% of the contaminants, such as greater than about 95% of the contaminants, greater than about 96% of the contaminants, greater than about 97% of the contaminants, greater than about 98% of the contaminants, or greater than about 99% of the contaminants as measured by conventional techniques.

The surface clean act may be conducted for an amount of time that ranges from about 5 seconds to about 5 minutes, such as from about 10 seconds to about 3 minutes, from about 10 seconds to about 2 minutes, from about 10 seconds to about 1 minute, from about 10 seconds to about 50 seconds, from about 10 seconds to about 40 seconds, from about 10 seconds to about 30 seconds, from about 10 seconds to about 20 seconds, from about 20 seconds to about 40 seconds, or from about 30 seconds to about 40 seconds. The clean temperature and duration of time of the surface clean act may be tailored to remove substantially all of the contaminants from the top surface 325 and sidewalls 310 of the silicon material 110. Following completion of the surface clean act, the silicon material 110 is substantially free of contaminants and exhibits dangling bonds on the top surface 325, rather than oxygen atoms of the hydroxyl groups.

After cleaning, the silicon material 110 may be vacuum annealed in the processing apparatus to repair damage to the top surface 325 and sidewalls 310 of the silicon material 110. The vacuum anneal may be conducted at a temperature of from about 600° C. to about 1000° C., such as from about 800° C. to about 1000° C., from about 800° C. to about 850° C., from about 850° C. to about 900° C., from about 900° C. to about 950° C., or from about 950° C. to about 1000° C., under a vacuum or in the presence of a reducing gas, such as $H_2$. This temperature is referred to herein as a so-called "repair temperature" and is the temperature of a chuck within the chamber of the processing apparatus. The silicon material 110 may be heated to the repair temperature during the vacuum anneal. The repair temperature may be a different temperature than the clean temperature. The repair temperature at which the vacuum anneal is conducted may enable silicon atoms to move from other locations of the silicon material 110 to the top surface 325 and sidewalls 310, repairing damage to the top surface 325 and sidewalls 310. The repair temperature is lower than the melting point (about 1414° C.) of the silicon material 110. During the vacuum anneal act, the pressure within the chamber of the processing apparatus may be maintained within a range of from about $6.7 \times 10^{-2}$ Pa to about 4.0 Pa (from about 0.5 mTorr to about 30 mTorr).

The vacuum anneal act may be conducted for an amount of time sufficient for the silicon atoms to move to the top surface 325 and sidewalls 310 of the silicon material 110. The silicon atoms may migrate sufficient distances to fill in damage created near surfaces of the silicon material 110 by vacancies in the silicon lattice. The vacuum anneal act may be conducted for an amount of time that ranges from about 5 seconds to about 5 minutes, such as from about 10 seconds to about 3 minutes, from about 10 seconds to about 2 minutes, from about 10 seconds to about 1 minute, from about 10 seconds to about 50 seconds, from about 10 seconds to about 40 seconds, from about 10 seconds to about 30 seconds, from about 10 seconds to about 20 seconds, from about 20 seconds to about 40 seconds, or from about 30 seconds to about 40 seconds.

The repair temperature and duration of time of the vacuum anneal act may be tailored to enable sufficient movement of the silicon atoms to the top surface 325 and sidewalls 310 of the silicon material 110. However, the repair temperature and duration of time are not of a sufficient degree or length to cause flow of the silicon material 110, which would negatively affect the shape and profile of the mesas 320 formed from the silicon material 110. The vacuum anneal act at the temperature below the melting point of silicon repairs the silicon material 110 such that the top surface 325, the bottom surface 315, and the sidewalls 310 of the silicon material 110 are substantially free of damage as measured by conventional techniques. After the vacuum anneal act, substantially all of the top surface 325 and sidewalls 310 of the silicon material 110 are free from damage. By way of example only, the top surface 325 and sidewalls 310 of the silicon material 110 may exhibit less than about 10% damage, such as less than about 5% damage, less than about 4% damage, less than about 3% damage, less than about 2% damage, or less than about 1% damage as measured by conventional techniques.

After conducting the vacuum anneal act, the silicon material 110 may be subjected to additional process acts, such as the formation of the insulating material 115, to form the semiconductor structures 100 including the silicon material 110. During the subsequent process acts, minimal silicon of the silicon material 110 is consumed or lost.

Accordingly, a method of reducing silicon consumption of a silicon material is disclosed. The method comprises cleaning a silicon material and subjecting the cleaned silicon material to a vacuum anneal at a temperature below a melting point of silicon and under vacuum conditions. The silicon material is subjected to additional process acts without substantially removing silicon of the silicon material.

To further improve the repair of the silicon material 110, a silicon source gas, such as silane (SiH$_4$), disilane, trisilane, pentasilane, etc., or combinations thereof, may optionally be flowed over the top surface 325 and sidewalls 310 of the silicon material 110 during the vacuum anneal act. The silicon source gas functions as an additional source of silicon atoms to repair damage in the silicon material 110. If present, the silicon source gas may be introduced into the chamber of the processing apparatus at a rate and for an amount of time sufficient to incorporate the additional silicon atoms into the silicon material 110. The silicon source gas may be introduced into the processing apparatus once or multiple times during the vacuum anneal act.

Without being bound by any theory, it is believed that the repair temperature and vacuum conditions during the vacuum anneal act provide the silicon atoms with sufficient mobility to move within the silicon material 110. Additionally, since the silicon material 110 is cleaned before conducting the vacuum anneal act, the silicon atoms are no longer bound, such as to oxygen atoms, and have greater mobility than bound silicon atoms. The mobility of the silicon atoms is achieved at a repair temperature well below the melting point of silicon, which is about 1414° C. The mobility of the silicon atoms is achieved at a significantly lower temperature than the melting point of silicon, enabling movement of the silicon atoms without exposing the silicon material 110 or other materials of the semiconductor structure 100 to a temperature that would oxidize or otherwise consume the silicon material 110. By utilizing the repair temperature that is less than the melting point of silicon, minimal consumption of the silicon material 110 is achieved.

By tailoring the clean temperature, the duration of the surface clean act, the repair temperature, the duration of the surface anneal act, the presence or absence of the cleaning gas, and the presence or absence of the silicon source gas, the silicon atoms may move to the top surface 325 and sidewalls 310 of the silicon material 110, repairing damage to the silicon material 110.

Figure 5:
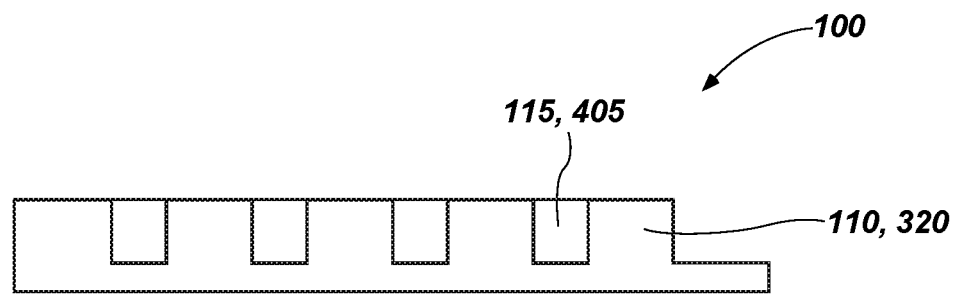
FIG. 5 is a cross-sectional view of the semiconductor structure of FIG. 2 during fabrication in accordance with embodiments of the disclosure.

After cleaning and repairing the silicon material 110, the STI trenches 307 are filled with the insulating material 115 to form STI structures 405, as shown in FIG. 5. The insulating material 115 may be an oxide material, a nitride material, or combinations thereof, such as a silicon oxide, a silicon oxynitride, a silicon nitride, or combinations thereof. At least a portion of the insulating material 115 may be of a so-called "high quality" in that the insulating material exhibits a high density and a high purity and is substantially homogeneous in composition. The insulating material 115 may be formed in the same chamber of the processing apparatus utilized to conduct the surface clean act and the vacuum anneal act. Alternatively, the insulating material 115 may be formed in the same chamber of the processing apparatus utilized to conduct the vacuum anneal act, with the surface clean act being conducted in a different chamber of the processing apparatus. In some embodiments, the surface clean act, the vacuum anneal act, and the insulating material formation act are conducted in a single (e.g., the same) chamber of the processing apparatus. In other embodiments, the surface clean act is conducted in one chamber of the processing apparatus, and the vacuum anneal act and the insulating material formation act are conducted in another chamber of the processing apparatus.

Figure 6:
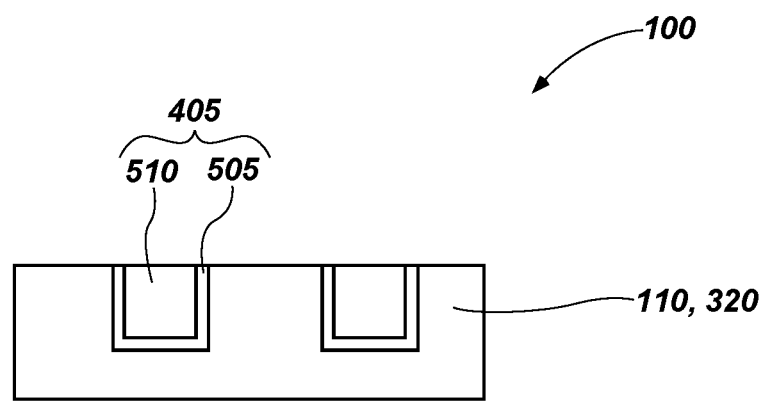
FIG. 6 is a cross-sectional view of the semiconductor structure including a liner material and a fill material during fabrication in accordance with embodiments of the disclosure.

While FIG. 5 illustrates the insulating material 115 as a single material, the insulating material 115 may include multiple insulating materials or multiple portions of a single insulating material. By way of example only, the STI structures 405 may include a liner material 505 and fill material 510, as shown in FIG. 6. In FIG. 6, only a portion of the semiconductor structure 100 of FIG. 5 is shown with relative dimensions of the liner material 505 and the fill material 510 in the STI structures 405 exaggerated for clarity. The liner material 505 may be formed in the STI trenches 307 before filling the remainder of the STI trenches 307 with the fill material 510. The liner material 505 may be a high quality oxide, such as a high quality, silicon oxide or a high quality, silicon oxynitride, or a high quality nitride, such as a high quality, silicon nitride. The liner material 505 may be formed by any deposition technique that conformally forms the liner material 505 in the STI trenches 307 and results in the high quality, insulating material. The liner material 505 is formed in situ on the sidewalls 310 of the silicon material 110 and in an atmosphere free of oxygen. Since the liner material 505 is formed in one of the chambers of the processing apparatus, the semiconductor structure 100 is not transferred between multiple processing apparatuses, reducing exposure of the semiconductor structure 100 to an oxidative environment or oxygen-containing atmosphere. The liner material 505 may exhibit a good interface with the silicon material 110, which is achieved following the surface clean act and vacuum anneal act of the top surface 325 of the silicon material 110.

The liner material 505 may, for example, be an oxide, such as a silicon oxide, formed by an ALD act. The liner material 505 may be formed over the sidewalls 310 and bottom surface 315 of the STI trenches 307. The ALD act may be conducted in an ALD apparatus that is configured to conduct the surface clean act, the vacuum anneal act, and the insulating material formation act at different temperatures, such as by adjusting a temperature within the ALD apparatus between the different process acts. The ALD apparatus is configured to conduct temperature ramps (e.g., temperature increases, temperature decreases) within one or more chambers of the ALD apparatus. Since the liner material 505 is formed by the ALD act, minimal consumption of the silicon material 110 occurs during the formation of the liner material 505 relative to a growth technique of forming a conventional liner material. The ALD act includes monolayer formation acts and thermal anneal acts conducted between each of the monolayer formation acts, with the monolayer formation acts conducted at different temperatures and the thermal anneal acts conducted at different temperatures.

The liner material 505 formed by the ALD act may be a high quality, silicon oxide that is formed by a deposition process rather than a growth process since conventional growth processes consume silicon. If the liner material 505 is formed from, for example, silicon oxide, the ALD act may form one monolayer (e.g., a silicon monolayer or an oxygen monolayer) at a time, with a thermal anneal act conducted after forming each silicon monolayer or oxygen monolayer and before forming the other of the silicon monolayer or oxygen monolayer. The silicon monolayer may be formed by exposing the silicon material 110 to a silicon-containing precursor to form a continuous silicon monolayer or a discontinuous silicon monolayer over the silicon material 110. Silicon-containing precursors are known in the art and are not described in detail herein. The silicon monolayer may be exposed to the silicon-containing precursor at a temperature T1 that is less than or equal to about 650° C. and for a sufficient amount of time to form the silicon monolayer. The silicon monolayer is then exposed to an increased temperature T2, where T2 is greater than about 650° C. and at least about 100° C. greater than the temperature T1. During the exposure at temperature T2, the silicon monolayer is exposed to an oxygen-containing precursor to form the oxygen monolayer on the silicon monolayer. Oxygen-containing precursors are known in the art and are not described in detail herein. The silicon monolayer is maintained at temperature T2 for an amount of time sufficient to form the oxygen monolayer on the silicon monolayer. The oxygen monolayer may be a continuous material or a discontinuous material. The oxygen monolayer reacts with the silicon monolayer to form a silicon oxide reaction product on the silicon material 110. After forming the oxygen monolayer, the silicon oxide reaction product may be exposed to a decreased temperature TL, where TL is less than or equal to about 650° C. and is at least about 50° C. lower than the temperature T2. The silicon monolayer formation act, increased temperature (T2) act, oxygen monolayer formation act, and decreased temperature (TL) act are repeated to form the liner material 505 at a desired thickness. The ALD act utilized may be as described in U.S. application Ser. No. 15/860,388, filed on Jan. 1, 2018, and titled "METHODS COMPRISING AN ATOMIC LAYER DEPOSITION SEQUENCE," the disclosure of which is hereby incorporated herein in its entirety by this reference and assigned to the assignee of the disclosure. However, other ALD processes may be used in which the liner material 505 is conformally formed as a high-quality insulating material. While the liner material 505 is described above as being formed from a silicon oxide, the liner material 505 may be formed from another insulating material, such as a silicon nitride or a silicon oxynitride, by appropriately selecting silicon-containing precursors, oxygen-containing precursors, or nitrogen-containing precursors.

The fill material 510 may then be formed in remaining portions of the STI trenches 307 to substantially fill the STI trenches 307 and form the STI structures 405, as shown in FIG. 6. The fill material 510 may include a silicon oxide, a silicon nitride, a silicon oxynitride, or other insulating material. The fill material 510 may be formed in the STI trenches 307 by a suitable deposition process. By way of example only, the fill material 510 may be formed by a spin-on deposition process, a CVD process, or a plasma CVD process. Excess fill material 510 located over the mesas 320 and the STI structures 405 may be removed by conventional techniques, such as by chemical mechanical planarization (CMP). Following the removal of excess fill material 510, a top surface of the mesas 320 is substantially coplanar with a top surface of the liner material 505 and a top surface of the fill material 510. The resulting semiconductor structure 100 thus, includes the mesas 320 isolated from one another by the STI structures 405.

Accordingly, a method of forming a semiconductor structure is disclosed. The method comprises cleaning a silicon material, vacuum annealing the silicon material, and forming an insulating material on the silicon material, where the cleaning, the vacuum annealing, and the forming are conducted in a single processing apparatus.

Accordingly, another method of forming a semiconductor structure is disclosed. The method comprises cleaning a silicon material, vacuum annealing the silicon material, and forming silicon dioxide on the silicon material without substantially removing silicon of the silicon material.

Embodiments herein describe the formation of semiconductor structures 100 including active areas 105 on which or in which the electronic devices, such as at least one transistor or capacitor, are formed. The semiconductor structures 100 may be incorporated into memory cells, such as dynamic random-access memory (DRAM) memory cells including capacitors and transistors. The transistors may be field effect transistors (FETs), such as those utilized in complementary metal oxide semiconductor (CMOS) circuits. However, the embodiments of the disclosure are not limited to the formation of DRAM memory cells and may be used in any application where minimal silicon loss is desired, such as in the fabrication of non-volatile memory cells and other integrated circuit components for a variety of different semiconductor devices.

After forming the STI structures 405, a nitride material, a gate dielectric material, a conductive gate material, a source region, a drain region, and a channel are formed in or over the mesas 320, forming transistors in the mesas 320. Alternatively or additionally, a first electrode, a capacitor dielectric material, and a second electrode are formed in or over the mesas 320, forming capacitors in the mesas 320. The electronic devices are formed by conventional techniques, which are not described in detail herein. The transistors and the capacitors are electrically coupled and additional process acts are conducted to form the semiconductor device including the semiconductor structures. The additional process acts include conventional techniques, which are not described in detail herein.

Accordingly, a method of forming isolation structures is disclosed. The method comprises vacuum annealing a silicon material, where the silicon material comprises trenches therein and the silicon material is substantially free from contaminants. An insulating material is formed in the trenches. The vacuum annealing and the forming are conducted in a single processing apparatus.

Figure 7:
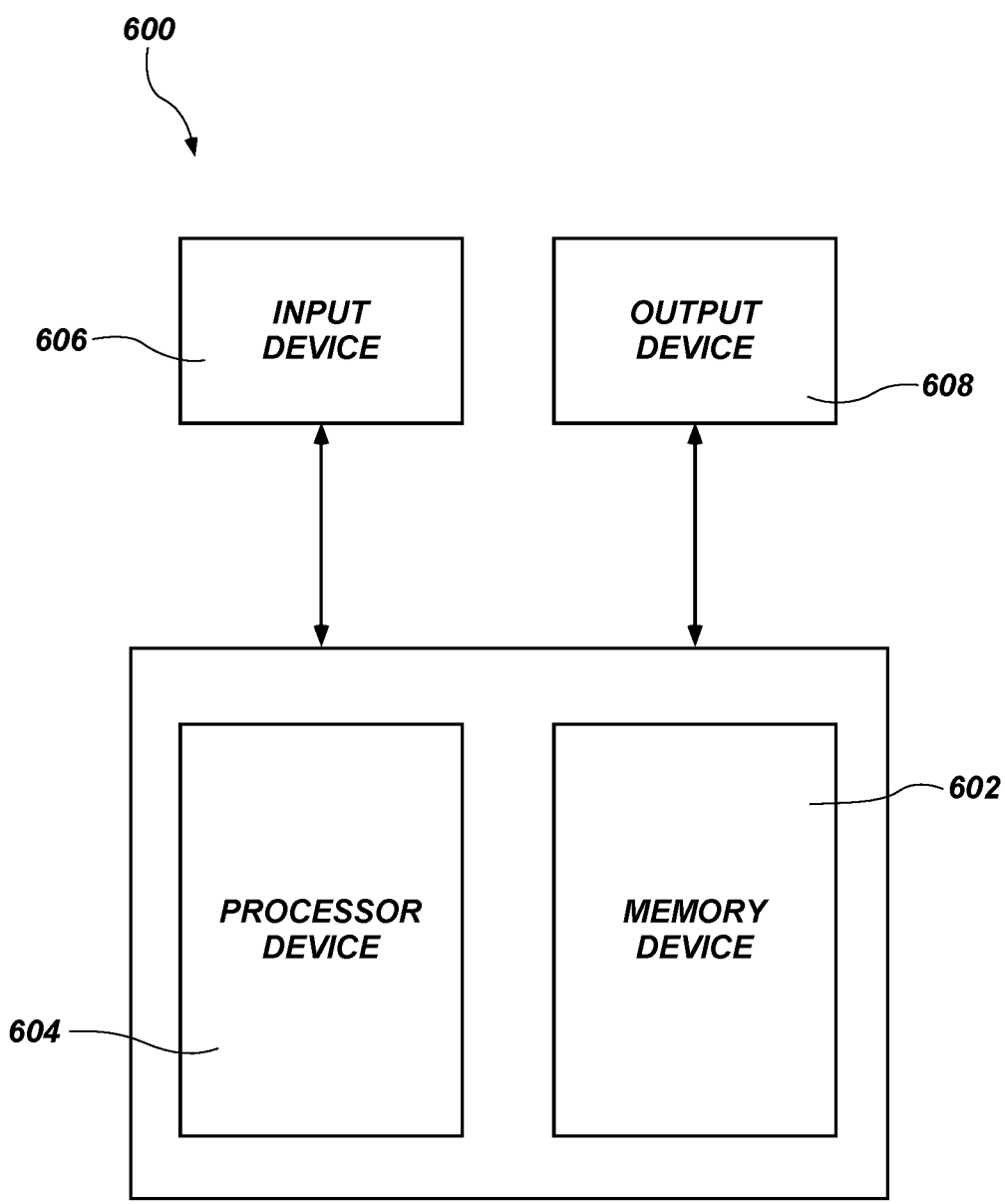
FIG. 7 is a schematic block diagram illustrating an electronic system including semiconductor structures formed in accordance with embodiments of the disclosure.

Semiconductor devices including the semiconductor structures 100 formed in accordance with embodiments of the disclosure may be formed by conducting additional process acts, which are not described in detail herein. The semiconductor devices may be used in an electronic system 600 as shown in FIG. 7. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602, which includes at least one semiconductor structure 100 as previously described. The at least one memory device 602 may include, for example, the semiconductor structures 100 as previously described. The electronic system 600 may further include at least one electronic signal processor device 604 (often referred to as a "microprocessor"). The electronic signal processor device 604 may, optionally, include at least one semiconductor structure 100 as previously described. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 may comprise a single touchscreen device that can be used both to input information to the electronic system 600 and to output visual information to a user. The one or more input devices 606 and output devices 608 may communicate electrically with at least one of the memory device 602 and the electronic signal processor device 604.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of reducing silicon consumption of a silicon material, comprising:
    cleaning a silicon material under vacuum conditions to substantially remove contaminants and hydroxyl groups without substantially removing silicon of the silicon material;
    subjecting the cleaned silicon material to an anneal at a temperature below a melting point of silicon and under vacuum conditions; and
    conducting additional process acts on the cleaned silicon material without substantially removing silicon of the silicon material.

2. The method of claim 1, wherein cleaning a silicon material comprises cleaning an exposed surface of the silicon material.

3. The method of claim 1, wherein cleaning a silicon material comprises removing contaminants comprising metals and polymers from the silicon material.

4. The method of claim 1, wherein cleaning a silicon material comprises cleaning a silicon material consisting of silicon, the contaminants, and the hydroxyl groups.

5. The method of claim 1, wherein subjecting the cleaned silicon material to an anneal comprises moving silicon atoms of the silicon material within the silicon material.

6. A method of forming a semiconductor structure, comprising:
    cleaning a silicon material comprising amorphous silicon, monocrystalline silicon, polycrystalline silicon, epitaxial-silicon, or a combination thereof without oxidizing a portion of the silicon material;
    vacuum annealing the silicon material; and
    forming an insulating material on the silicon material,
    wherein the cleaning, the vacuum annealing, and the forming are conducted in a single processing apparatus.

7. The method of claim 6, wherein cleaning a silicon material, vacuum annealing the silicon material, and forming an insulating material on the silicon material comprises conducting the cleaning the silicon material, the vacuum annealing the silicon material, and the forming the insulating material without exposing the silicon material to an oxidative environment.

8. The method of claim 6, wherein cleaning a silicon material comprises exposing the silicon material to one or more of a hydrogen fluoride-based etch chemistry, a sulfuric acid-based etch chemistry, or a chlorine-based etch chemistry.

9. The method of claim 6, wherein forming an insulating material on the silicon material comprises forming the insulating material by atomic layer deposition.

10. The method of claim 6, wherein forming an insulating material on the silicon material comprises forming one or more of silicon dioxide, a silicon oxynitride, or a silicon nitride on the silicon material.

11. A method of forming isolation structures in a single processing apparatus, the method comprising:
    vacuum annealing at a temperature of between about 900° C. and about 1000° C. a silicon material comprising trenches therein, the silicon material being substantially free from contaminants and hydroxyl groups; and
    forming an insulating material in the trenches,
    wherein the vacuum annealing and the forming are conducted in a single processing apparatus.

12. The method of claim 11, wherein vacuum annealing a silicon material comprises vacuum annealing active areas of the silicon material.

13. The method of claim 12, wherein forming an insulating material in the trenches comprises forming the insulating material between adjacent active areas.

14. The method of claim 11, wherein forming an insulating material in the trenches comprises forming silicon dioxide in the trenches by high density plasma chemical vapor deposition.

15. The method of claim 11, wherein forming an insulating material in the trenches comprises forming silicon dioxide by thermal processing.

16. A method of forming a semiconductor structure, comprising:
    cleaning a silicon material for between 5 seconds and 5 minutes without substantially removing silicon of the silicon material;
    vacuum annealing the silicon material; and forming silicon dioxide on the silicon material without substantially removing silicon of the silicon material.

17. The method of claim 16, wherein cleaning a silicon material comprises cleaning the silicon material at a first temperature and wherein vacuum annealing the silicon material comprises vacuum annealing the silicon material at a second temperature, the first temperature different from the second temperature.

18. The method of claim 16, wherein vacuum annealing the silicon material comprises causing less than about 10% damage to a top surface and sidewalls of the silicon material.

19. The method of claim 16, wherein forming silicon dioxide on the silicon material comprises forming a high quality interface between the silicon dioxide and the silicon material without substantially removing silicon of the silicon material.

20. The method of claim 1, wherein cleaning a silicon material comprises conducting the cleaning at a temperature from about 700° C. to about 2000° C.

21. The method of claim 1, wherein cleaning a silicon material comprises conducting the cleaning at a temperature from about 750° C. to about 800° C.

22. The method of claim 1, wherein cleaning a silicon material comprises conducting the cleaning at a temperature from about 800° C. to about 900° C.

* * * * *